United States Patent
Xia (10) Patent No.: US 10,431,631 B2
(45) Date of Patent: Oct. 1, 2019

(54) STACKED OLED DEVICE AND METHOD OF MAKING THE SAME

(71) Applicant: Wuhan China Star Optoelectronics Semiconductor Display Technology Co., Ltd., Wuhan, Hubei (CN)

(72) Inventor: Cunjun Xia, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/749,187

(22) PCT Filed: Jan. 2, 2018

(86) PCT No.: PCT/CN2018/070039
§ 371 (c)(1),
(2) Date: Jan. 31, 2018

(87) PCT Pub. No.: WO2019/109438
PCT Pub. Date: Jun. 13, 2019

(65) Prior Publication Data
US 2019/0172876 A1 Jun. 6, 2019

(30) Foreign Application Priority Data
Dec. 4, 2017 (CN) .......................... 2017 1 1258605

(51) Int. Cl.
*H01L 27/32* (2006.01)
*H01L 51/56* (2006.01)
(Continued)

(52) U.S. Cl.
CPC ...... *H01L 27/3209* (2013.01); *H01L 27/3218* (2013.01); *H01L 27/3246* (2013.01);
(Continued)

(58) Field of Classification Search
CPC .................................................. H01L 27/3209
See application file for complete search history.

(56) References Cited

U.S. PATENT DOCUMENTS

| 5,707,745 A * | 1/1998 | Forrest | C09K 11/06 |
| | | | 428/432 |
| 5,837,391 A * | 11/1998 | Utsugi | H01L 27/3209 |
| | | | 428/690 |

(Continued)

*Primary Examiner* — Victoria K. Hall
(74) *Attorney, Agent, or Firm* — Hauptman Ham, LLP (57) ABSTRACT

The disclosure provides a stacked OLED device and a method thereof, wherein the device comprises a forward and reverse of a first OLED structure, and a second forward OLED structure stacked from bottom to top on a substrate sequentially; a charge generation layer disposed between the forward and reverse of the first OLED structure as a common cathode, and each organic functional layer in the forward and reverse of the first OLED structure are symmetrical with the charge generation layer; a transparent insulating layer disposed between the first reverse and the second forward OLED structure; an anode of the first and second forward OLED structure are connected through a conductive layer. The disclosure reduces the use of a precision mask so that a space occupied by three primary colors is reduced, greatly increases a pixel resolution, improves a product yield rate, saves the cost, and enhances a product competitiveness.

10 Claims, 4 Drawing Sheets

(51) Int. Cl.
*H01L 51/50* (2006.01)
*H01L 51/52* (2006.01)

(52) U.S. Cl.
CPC ...... *H01L 51/5056* (2013.01); *H01L 51/5072* (2013.01); *H01L 51/5092* (2013.01); *H01L 51/5203* (2013.01); *H01L 51/5206* (2013.01); *H01L 51/5221* (2013.01); *H01L 51/56* (2013.01); *H01L 51/5088* (2013.01); *H01L 51/5209* (2013.01); *H01L 51/5225* (2013.01); *H01L 51/5234* (2013.01)

(56) References Cited

U.S. PATENT DOCUMENTS

| | | | | |
|---|---|---|---|---|
| 5,917,280 A | * | 6/1999 | Burrows | H01L 27/3209 |
| | | | | 313/503 |
| 2005/0264550 A1 | * | 12/2005 | Ohshima | G09G 3/3233 |
| | | | | 345/204 |
| 2006/0006792 A1 | * | 1/2006 | Strip | H01L 27/3209 |
| | | | | 313/500 |
| 2009/0078955 A1 | | 3/2009 | Fan et al. | |
| 2013/0240847 A1 | * | 9/2013 | Zakhidov | H01L 27/3202 |
| | | | | 257/40 |
| 2018/0233689 A1 | * | 8/2018 | Kim | H01L 51/5088 |
| 2019/0131356 A1 | * | 5/2019 | Steckel | H01L 51/5072 |

\* cited by examiner

A first forward OLED structure, a first reverse OLED structure and a second forward OLED structure stacked in order from bottom to top on a substrate; wherein a charge generation layer disposed between the first forward OLED structure and the first reverse OLED structure as a common cathode of the first forward OLED structure and the first reverse OLED structure, and each organic functional layer in the first forward OLED structure and each organic functional layer in the first reverse OLED structure are symmetrical with the charge generation layer.

↓

A second forward OLED structure stacked on a first reverse OLED structure, and a transparent insulating layer disposed between a first reverse OLED structure and a second forward OLED structure.

↓

An anode of the first forward OLED structure and an anode of the second forward OLED structure are connected through a conductive layer.

STACKED OLED DEVICE AND METHOD OF MAKING THE SAME

RELATED APPLICATIONS

The present application is a National Phase of International Application Number PCT/CN2018/070039, filed Jan. 2, 2018, and claims the priority of China Application No. 201711258605.0 filed Dec. 4, 2017.

FIELD OF THE DISCLOSURE

The disclosure relates to a screen display technology field, and more particularly to a stacked OLED device and a method of making the same.

BACKGROUND

Nowadays, the OLED display panel comprises three general types: side by side RGB pixelation type, conversion material (CCM) type, and a color filter type. The mainstream display type of OLED panel is achieved by arranging three primary colors of red, blue and green pixels on a same side of the panel in parallel, and controlling the screen display by a driving circuit. This type of display needs to compress the pixel spaces to improve the pixel resolution, however, the manufacturing process is difficult, the cost is high, and the yield rate is relatively. Besides, the preparation process of the side by side RGB pixelation type OLED display pixels requires five fine metal masks (FMM), high precision CCD alignment and other preparation methods, which makes the process more complex, and resulting in low yield rate, high preparation cost and other issues.

SUMMARY

The technical problem to be solved by a present disclosure is to provide a stacked OLED device and a method of making the same, so as to improve a pixel resolution, improve a yield rate of product, and save cost.

To solve an above technical problem, the present disclosure provides a stacked OLED device, comprising:

A first forward OLED structure, a first reverse OLED structure and a second forward OLED structure stacked in order from bottom to top on a substrate;

A charge generation layer disposed between the first forward OLED structure and the first reverse OLED structure as a common cathode of the first forward OLED structure and the first reverse OLED structure, and each organic functional layer in the first forward OLED structure and each organic functional layer in the first reverse OLED structure are symmetrical with the charge generation layer;

A transparent insulating layer disposed between the first reverse OLED structure and the second forward OLED structure;

An anode of the first forward OLED structure and an anode of the second forward OLED structure are connected through a conductive layer.

Wherein, the first forward OLED structure comprises: a first anode, a first hole injection layer, a first hole transport layer, a first light-emitting layer, a first electron transport layer, and a first electron injection layer which are sequentially stacked from bottom to top on the substrate; and the first reverse OLED structure comprises: a second electron injection layer, a second electron transport layer, a second light-emitting layer, a second hole transport layer, a second hole injection layer and a second transparent anode which are sequentially stacked from top to bottom on the charge generation layer.

Wherein, the second forward OLED structure comprises: a third transparent anode, a third hole injection layer, a third hole transport layer, a third light-emitting layer, a third electron transport layer, a third electron injection layer, and a transparent cathode which are sequentially stacked from bottom to top on the transparent insulating layer.

Wherein, the conductive layer is covered with a second insulating layer and a third insulating layer, the second insulating layer is located between the first anode and the third transparent anode, and the third insulating layer is located between the first anode and the third hole injection layer.

Wherein, colors of the first light-emitting layer, the second light-emitting layer, and the third light-emitting layer are different from each other.

The present disclosure further provides the method of making the stacked OLED device, comprising:

Stacking the first forward OLED structure, the first reverse OLED structure and the second forward OLED structure in order from bottom to top on the substrate; and disposing the charge generation layer between the first forward OLED structure and the first reverse OLED structure as the common cathode of the first forward OLED structure and the first reverse OLED structure, and making each organic functional layer in the first forward OLED structure and each organic functional layer in the first reverse OLED structure being symmetrical with the charge generation layer;

Stacking the second forward OLED structure on the first reverse OLED structure, and disposing the transparent insulating layer between the first reverse OLED structure and the second forward OLED structure;

Connecting the anode of the first forward OLED structure and the anode of the second forward OLED structure through the conductive layer.

Wherein, stacking the first forward OLED structure and the first reverse OLED structure in order from bottom to top on the substrate specifically comprises:

Forming a pixel definition layer, the conductive layer and a protective layer covering the pixel definition layer and the conductive layer on the substrate by using a film-forming process and a photolithography technique of coating, exposing process and development processes;

Stacking the first hole injection layer, the first hole transport layer, the first light-emitting layer, the first electron transport layer, the first electron injection layer, and the charge generation layer of the first forward OLED structure sequentially on the first anode of the substrate by a thermal evaporation;

Stacking the second electron injection layer, the second electron transport layer, the second light-emitting layer, the second hole transport layer, the second hole injection layer and the second transparent anode sequentially from top to bottom on the charge generation layer.

Wherein, in the process of stacking the first forward OLED structure and the first reverse OLED structure in order from bottom to top on the substrate, a type of a mask used for a vapor deposition of the second transparent anode is a second open mask, and another type of the mask used for the other layers is a first open mask, and other type of the mask used when the transparent insulating layer is disposed between the first reverse OLED structure and the second forward OLED structure is the second open mask.

Wherein stacking the second forward OLED structure on the first reverse OLED structure specifically comprises:

Removing the protective layer covering the pixel definition layer and the conductive layer prepared on the substrate by a stripping technology;

Preparing an inverted trapezoidal pixel definition layer by the photolithography technique of coating, exposing and development processes;

Preparing a third transparent anode on the inverted trapezoidal pixel definition layer by the thermal evaporation;

Removing the inverted trapezoidal pixel definition layer by the stripping technology;

Depositing a third hole injection layer, a third hole transport layer, a third light-emitting layer, a third electron transport layer, a third electron injection layer and a transparent cathode of the second forward OLED structure sequentially on the third transparent anode by the thermal evaporation.

Wherein, the type of the mask used for the vapor deposition of the third transparent anode is a first open mask, and another type of the mask used for the vapor deposition of the transparent anode is a third open mask, and other type of the mask used for the other layers is the first open mask.

The beneficial effects of the embodiments of the present invention are: the use of a precision mask can be omitted during the process of preparing a full-color panel, thereby reducing the difficulty of preparing the full-color OLED panel, due to a stacked structure, a space occupied by the three primary colors is reduced, a pixel resolution can be greatly increased, a yield rate of a product is improved, the cost can be saved, and a competitiveness of the product can be enhanced.

BRIEF DESCRIPTION OF THE DRAWINGS

To describe the technical solutions in the embodiments of the present disclosure or in the prior art more clearly, the following briefly introduces the accompanying figures required for describing the embodiments or the prior art; apparently, the accompanying figures in the following description show merely some embodiments of the present disclosure, and persons of ordinary skill in the art may still derive other figures from these accompanying figures without creative efforts.

DETAILED DESCRIPTION OF PREFERRED EMBODIMENTS

The following description of various embodiments is made with reference to the accompanying figures to illustrate specific embodiments in which the present disclosure may be practiced.

Figure 1:
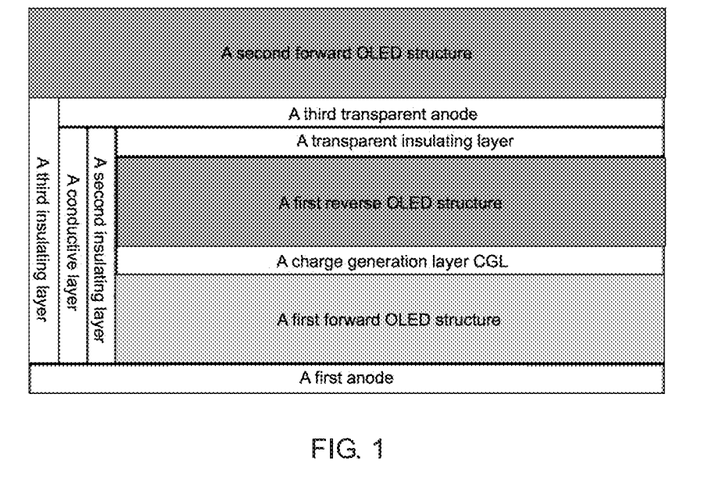
FIG. 1 is a structural schematic view of a stacked OLED device according to an embodiment 1 of the present disclosure.

See FIG. 1, an embodiment 1 of the present disclosure provides a stacked OLED device, comprising:

A first forward OLED structure, a first reverse OLED structure and a second forward OLED structure stacked in order from bottom to top on a substrate;

A charge generation layer disposed between the first forward OLED structure and the first reverse OLED structure as a common cathode of the first forward OLED structure and the first reverse OLED structure, and each organic functional layer in the first forward OLED structure and each organic functional layer in the first reverse OLED structure are symmetrical with the charge generation layer;

A transparent insulating layer disposed between the first reverse OLED structure and the second forward OLED structure;

An anode of the first forward OLED structure and an anode of the second forward OLED structure are connected through a conductive layer.

For the stacked OLED device of the embodiment, using a high-frequency pulse voltage and a current signal to drive for the first forward OLED structure, the first reverse OLED structure, by adjusting an amplitude of a positive and a negative direction of the high-frequency pulse voltage and the current signal, so that the first forward OLED structure, the first reverse OLED structure are independent to emit a light of corresponding primary color light and a multiple composite light of two primary colors, and the second forward OLED structure adopts a direct current signal to drive and so on, in order to realize a single pixel structure, which can independently emit the light of three primary colors and other composite light. At the same time, the OLED device of the present embodiment can eliminate the need of FMM (Precision Mask Version) during the process of preparing a full-color panel, thereby reducing the difficulty of preparing the full-color OLED panel, and the stacked OLED device reduces an occupancy space of the three primary colors, which can increase a pixel resolution greatly, improving a yield rate of a product and saving the cost, enhancing a competitiveness of the product.

Figure 2:
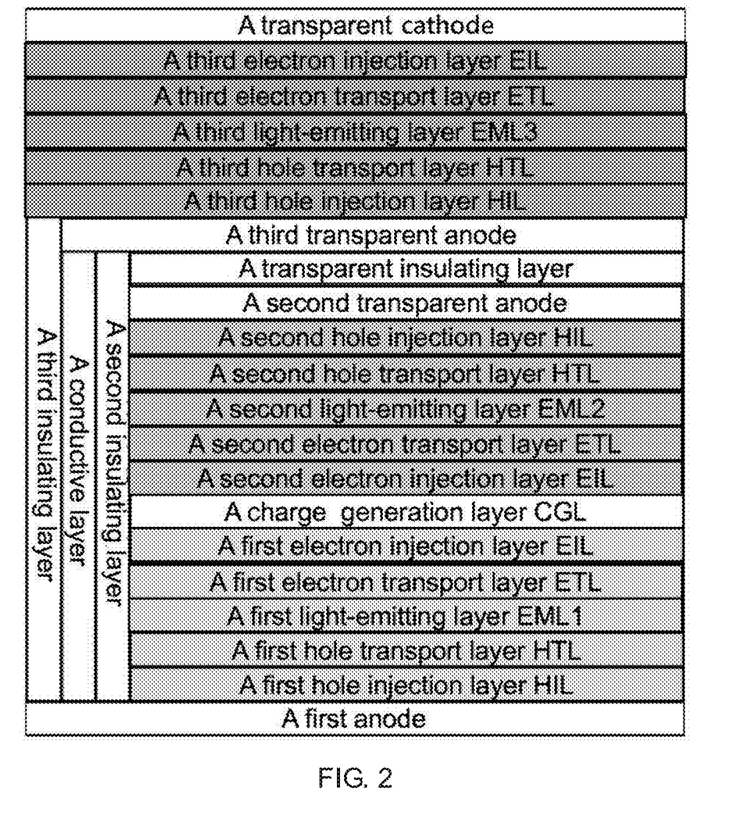
FIG. 2 is a specific structural schematic view of a stacked OLED device according to an embodiment 1 of the present disclosure.

Specifically, as shown in FIG. 2, the first forward OLED structure comprises a first anode, a first hole injection layer HIL, a first hole transport layer HTL, a first light-emitting layer EML 1, a first electron transport layer ETL, and a first electron injection layer EIL which are sequentially stacked from bottom to top on the substrate; and the first reverse OLED structure comprises a second electron injection layer EIL, a second electron transport layer ETL, a second light-emitting layer EML 2, a second hole transport layer HTL, a second hole injection layer HIL and a second transparent anode which are sequentially stacked from top to bottom on the charge generation layer CGL. It can be seen from this that a stacking order of each organic functional layer in the first forward OLED structure is opposite to that of each organic functional layer in the first reverse OLED structure, that is, each organic functional layer in the first forward OLED structure and each organic functional layer in the first reverse OLED structure are symmetrical with the charge generation layer, for example, upper and lower sides of the charge generation layer are a first electron injection layer EIL of the first forward OLED structure and a second electron injection layer EIL of the first reverse OLED structure respectively, and then the first electron transport layer ETL of the first forward OLED structure and the second electron transport layer ETL of the first reverse OLED structure respectively, and so on. It can be understood that a "forward direction" of the first forward OLED structure means that the stacking order is the same as that of an order of a general OLED stacking, that is, the anode the organic functional layer—a cathode; and a "reverse direction" of the first inverted OLED structure means that the stacking order is opposite to that of the order of the general OLED stacking. Therefore, the stacking order of the organic functional layer of the second forward OLED structure is the same as the stacking order of the organic functional layer of the first forward OLED structure, specifically comprising: a third transparent anode, a third hole injection layer HIL, a third hole transport layer HTL, a third light-emitting layer EML 3, a third electron transport layer ETL, a third electron injection layer EIL, and a transparent cathode which are sequentially stacked from bottom to top on the transparent insulating layer.

It should be noted that, in this embodiment, a main function of the charge generation layer in the first forward OLED structure and the first reverse OLED structure is to ensure that the stacked OLED device of the embodiment can be driven under an alternating current (AC) to light and improve a luminous efficiency; and the main function of the transparent insulating layer between the second forward OLED structure and the first reverse OLED structure is to ensure that the second forward OLED structure is not to be affected by the first reverse OLED structure.

In the stacked OLED device of this embodiment, the first forward OLED structure, the first reverse OLED structure and the second forward OLED structure comprise the colors of the light-emitting layers which can be arbitrarily set in three primary colors of red, green and blue, and not be limited to its order in the stacked structures; for example, the first light-emitting layer 1 in the first forward OLED structure may be a red light-emitting layer, and the second light-emitting layer 2 in the first reverse OLED structure may be a green light-emitting layer, and the third light-emitting layer 3 in the second forward OLED structure may be a blue light-emitting layer; For another example, the first light-emitting layer 1 in the first forward OLED structure may be the blue light-emitting layer, and the second light-emitting layer 2 in the first inverse OLED structure may be the red light-emitting layer, and the third light-emitting layer 3 in the second forward OLED structure may be the green light-emitting layer. Preferably, the first light-emitting layer 1 in the first forward OLED structure is the green light-emitting layer, and the second light-emitting layer 2 in the first reverse OLED structure is the red light-emitting layer, and the third light-emitting layer 3 in the second forward OLED structure is the blue light-emitting layer.

Further, in this embodiment, the conductive layer is covered with a second insulating layer and a third insulating layer, and the second insulating layer is located between the first anode and the third transparent anode, and the third insulating layer is located between the first anode and the third hole injection layer, so as to provide an insulating protection for an electrical connection between the first anode of the first forward OLED structure and the third transparent anode of the second forward OLED structure.

Figure 3:
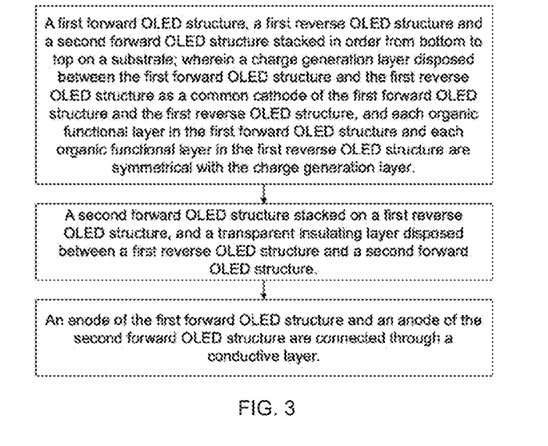
FIG. 3 is a schematic flow chart of a method of making a stacked OLED device according to an embodiment 2 of the present disclosure.

Corresponding to the embodiment 1 of the present disclosure, an embodiment 2 of the present disclosure provides a method of making the stacked OLED device, as shown in FIG. 3, comprising:

Stacking the first forward OLED structure, the first reverse OLED structure and the second forward OLED structure in order from bottom to top on the substrate; and disposing the charge generation layer between the first forward OLED structure and the first reverse OLED structure as a common cathode of the first forward OLED structure and the first reverse OLED structure, and making each organic functional layer in the first forward OLED structure and each organic functional layer in the first reverse OLED structure being symmetrical with the charge generation layer;

Stacking the second forward OLED structure on the first reverse OLED structure, and disposing the transparent insulating layer between the first reverse OLED structure and the second forward OLED structure;

The anode of the first forward OLED structure and the anode of the second forward OLED structure are connected through the conductive layer.

Figure 4:
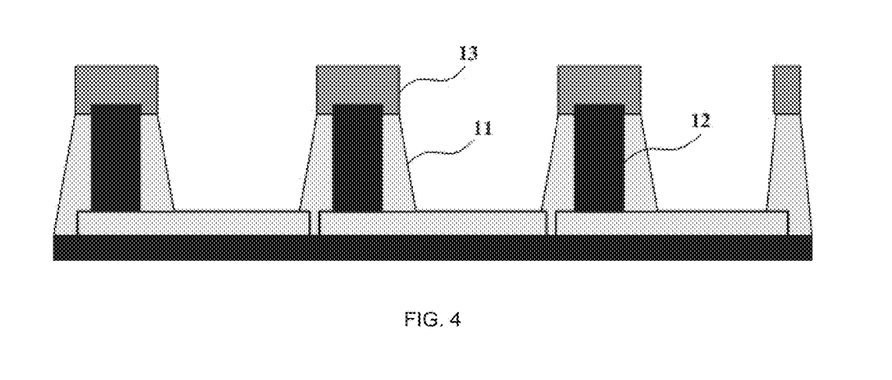
FIG. 4 is a structural schematic view of a pixel definition layer, a conductive layer and a protective layer covering the conductive layer prepared on a substrate according to an embodiment 2 of the present disclosure.

Specifically, as shown in FIG. 4, firstly, preparing a pixel definition layer 11 (PDL), the conductive layer 12, and a protective layer 13 covering the conductive layer 12 on the substrate by using a film-forming process and a photolithography technique of coating, exposing and development processes.

Figure 5A:
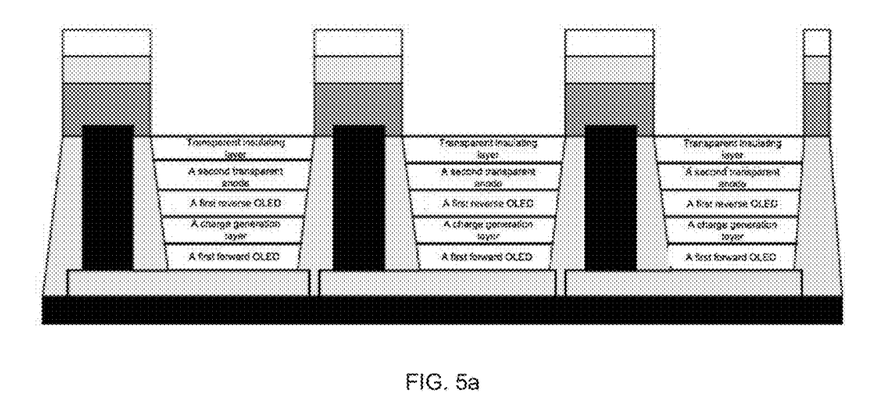
FIG. 5a to FIG. 5f are respectively structural schematic views of a stacked OLED device prepared by each intermediate process according to an embodiment 2 of the present disclosure.

Then see FIG. 5a, stacking the first hole injection layer, the first hole transport layer, the first light-emitting layer 1, the first electron transport layer, the first electron injection layer, and the charge generation layer of the first forward OLED structure sequentially on the first anode (as the anode of the first forward OLED structure) of the substrate by a thermal evaporation; due to the charge generation layer which is the common cathode of the first forward OLED structure and the first reverse OLED structure, and each organic functional layer in the first forward OLED structure and each organic functional layer in the first reverse OLED structure are symmetrical with the charge generation layer; therefore, when each organic functional layer of the first reverse OLED structure is stacked from bottom to top on the charge generation layer, stacking order of each organic functional layer in the first forward OLED structure is opposite to which of each organic functional layer in the first reverse OLED structure, and the second electron injection layer, the second electron transport layer, the second light-emitting layer 2, the second hole transport layer, the second hole injection layer and the second transparent anode (as the anode of the first reverse OLED structure) are sequentially stacked from top to bottom on the charge generation layer, thereby it completes a preparation of the first forward OLED structure and the first reverse OLED structure. And then, the transparent insulating layer is deposited on the second transparent anode. It should be illustrated that a type of the mask used for a vapor deposition of the second transparent anode and the transparent insulating layer is a second open mask (OPEN-MASK 2), which is convenient to connect between the second transparent anode and a corresponding peripheral lead, as well as to protect the second transparent anode by the transparent insulating layer; and the type of the mask used by the other layers is a first open mask (OPEN-MASK 1).

Figure 5B:
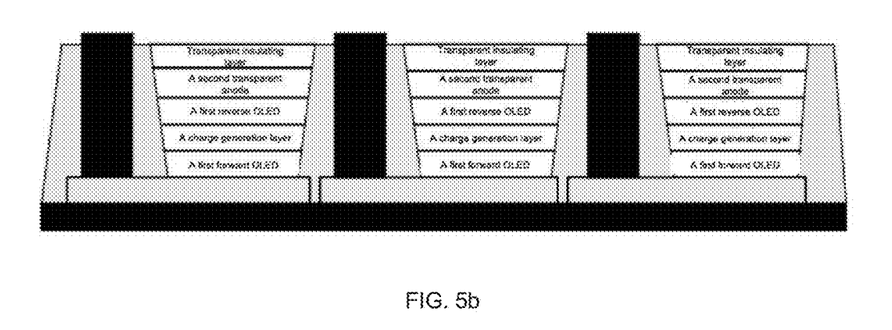
Figure 5C:
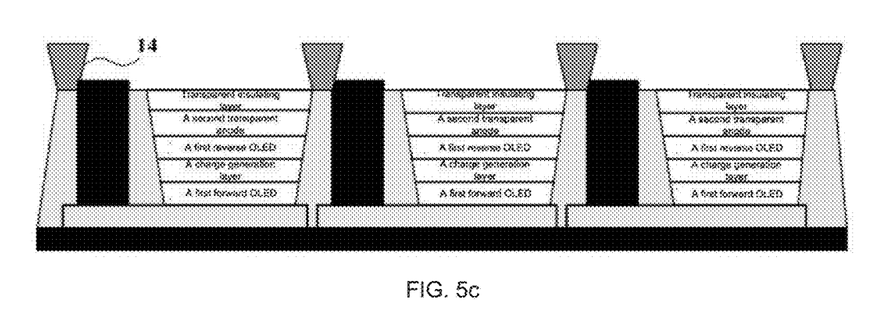
Figure 5D:
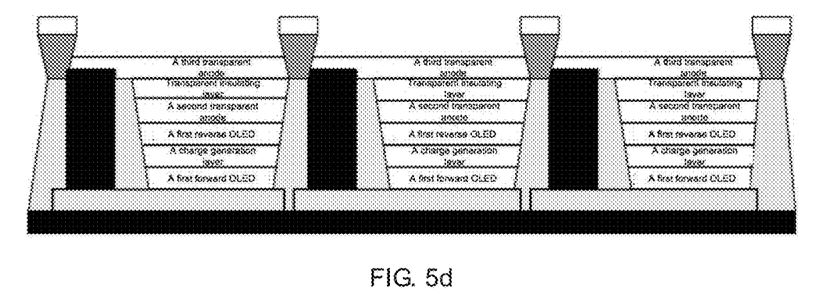
Figure 5E:
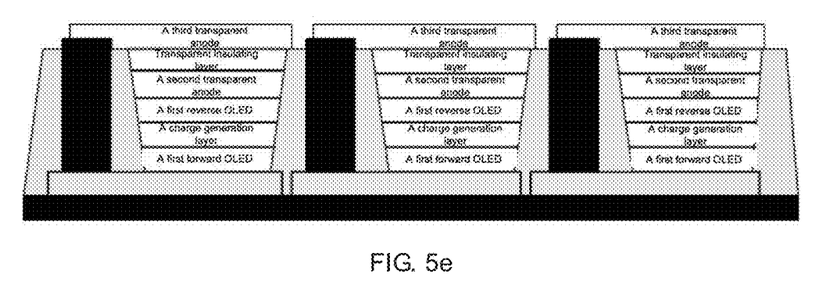
Figure 5F:
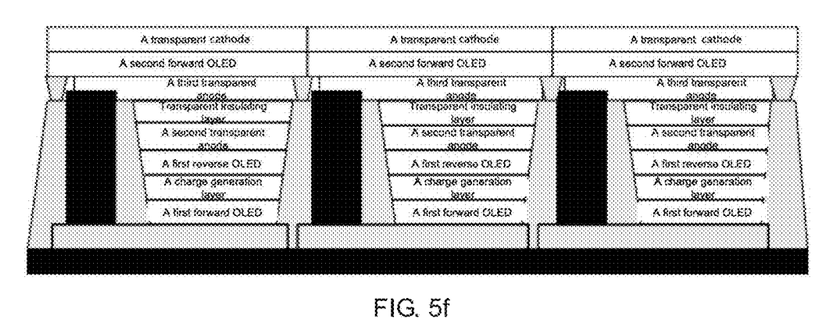

See FIG. 5b, removing the protective layer which covers the pixel definition layer and the conductive layer by a stripping technology. Then see FIG. 5c, preparing an inverted trapezoidal pixel definition layer 14 on the structure shown in FIG. 5b by photolithography, such as coating, exposing and development processes. In order to illustrate the flow according to one of the embodiment of making the stacked OLED device more clearly, in FIGS. 5a, 5b and 5c, the second transparent anode is shown separately from the first reverse OLED structure. Next, as shown in FIG. 5d, the transparent anode—the third transparent anode is prepared on the structure shown in FIG. 5c by thermal evaporation to serve as the anode for the second forward OLED structure. The type of mask used herein is the first open mask (OPEN-MASK 1). Furthermore, as shown in FIG. 5e, the inverted trapezoidal pixel defining layer 14 which shown in FIG. 5c is removed by the stripping technology. Similarly, in order to show more clearly the flow of the method of making the stacked OLED device according to this embodiment, in FIG. 5d and FIG. 5e, the third transparent anode is separately from the second forward OLED structure. Finally, as shown in FIG. 5f, stacking the third hole injection layer, the third hole transport layer, the third light-emitting layer 3, the third electron transport layer, the third electron injection layer and the transparent cathode of the second forward OLED structure sequentially on the third transparent anode by the thermal evaporation, thereby it completes the preparation of the second forward OLED structure. It should be noted that, in order to show more clearly the flow of the method of making the stacked OLED device according to this embodiment, in FIG. 5f, the third transparent anode and the transparent cathode are shown separately from the second forward OLED structure. Wherein, the type of the mask used for the vapor deposition of the transparent cathode is a third open mask (OPEN-MASK 3), which is convenient to connect between the transparent cathode and the corresponding peripheral lead, and the type of the mask used by the other layers is a first open mask (OPEN-MASK 1).

The anode of the first forward OLED structure and the anode of the second forward OLED structure are connected through the conductive layer, so that when driving for the first forward OLED structure, the first reverse OLED structure using the high-frequency pulse voltage and the current signal drive, and by adjusting the amplitude of the positive and the negative direction of the high-frequency pulse voltage and the current signal, so that the first forward OLED structure, the first reverse OLED structure are independent to emit the light of corresponding primary color light and the multiple composite light of two primary colors It can be seen from the above description that the beneficial effects of the embodiments of the present disclosure are that the use of a precision mask can be omitted during the process of preparing the full-color panel, thereby reducing the difficulty of preparing the full-color OLED panel, due to the stacked structure, the space occupied by the three primary colors is reduced, the pixel resolution can be greatly increased, the yield rate of a product is improved, the cost can be saved, and the competitiveness of the product can be enhanced.

The above disclosure is only the preferred embodiments of the present disclosure, and certainly can not be used to limit the scope of the present disclosure; therefore, equivalent changes made according to the claims of the present disclosure are still within the scope of the present disclosure.

What is claimed is:

1. A stacked OLED device, comprising
a first forward OLED structure, a first reverse OLED structure and a second forward OLED structure stacked in order from bottom to top on a substrate;
a charge generation layer disposed between the first forward OLED structure and the first reverse OLED structure as a common cathode of the first forward OLED structure and the first reverse OLED structure, and each organic functional layer in the first forward OLED structure and each organic functional layer in the first reverse OLED structure are symmetrical with the charge generation layer;
a transparent insulating layer disposed between the first reverse OLED structure and the second forward OLED structure;
an anode of the first forward OLED structure and an anode of the second forward OLED structure are connected through a conductive layer.

2. The stacked OLED device according to claim 1, wherein the first forward OLED structure comprises: a first anode, a first hole injection layer, a first hole transport layer, a first light-emitting layer, a first electron transport layer, and a first electron injection layer which are sequentially stacked from bottom to top on the substrate; and the first reverse OLED structure comprises: a second electron injection layer, a second electron transport layer, a second light-emitting layer, a second hole transport layer, a second hole injection layer and a second transparent anode which are sequentially stacked from top to bottom on the charge generation layer.

3. The stacked OLED device according to claim 2, wherein the second forward OLED structure comprises: a third transparent anode, a third hole injection layer, a third hole transport layer, a third light-emitting layer, a third electron transport layer, a third electron injection layer, and a transparent cathode which are sequentially stacked from bottom to top on the transparent insulating layer.

4. The stacked OLED device according to claim 3, wherein the conductive layer is covered with a second insulating layer and a third insulating layer, the second insulating layer is located between the first anode and the third transparent anode, and the third insulating layer is located between the first anode and the third hole injection layer.

5. The stacked OLED device according to claim 1, wherein colors of the first light-emitting layer, the second light-emitting layer, and the third light-emitting layer are different from each other.

6. A method of making a stacked OLED device, comprising:
stacking a first forward OLED structure and a first reverse OLED structure and a second forward OLED structure in order from bottom to top on a substrate; and disposing a charge generation layer between the first forward OLED structure and the first reverse OLED structure as a common cathode of the first forward OLED structure and the first reverse OLED structure, and making each organic functional layer in the first forward OLED structure and each organic functional layer in the first reverse OLED structure being symmetrical with the charge generation layer;
stacking a second forward OLED structure on the first reverse OLED structure, and disposing a transparent insulating layer between the first reverse OLED structure and the second forward OLED structure;
connecting an anode of the first forward OLED structure and the anode of the second forward OLED structure through a conductive layer.

7. The method of making a stacked OLED device according to claim 6, wherein stacking the first forward OLED structure and the first reverse OLED structure in order from bottom to top on the substrate specifically comprises:
forming a pixel definition layer, a conductive layer and a protective layer covering the pixel definition layer and the conductive layer on the substrate by using a film-forming process and a photolithography technique of a coating, exposing and development processes;
stacking a first hole injection layer, a first hole transport layer, a first light-emitting layer, a first electron transport layer, a first electron injection layer, and a charge generation layer of the first forward OLED structure sequentially on the first anode of the substrate by a thermal evaporation;

stacking a second electron injection layer, a second electron transport layer, a second light-emitting layer, a second hole transport layer, a second hole injection layer and a second transparent anode sequentially from top to bottom on the charge generation layer.

8. The method of making a stacked OLED device according to claim 7, wherein in the process of stacking the first forward OLED structure and the first reverse OLED structure in order from bottom to top on the substrate, a type of a mask used for a vapor deposition of the second transparent anode is a second open mask, and another type of the mask used for the other layers is a first open mask, and other type of the mask used when the transparent insulating layer is disposed between the first reverse OLED structure and the second forward OLED structure is the second open mask.

9. The method of making a stacked OLED device according to claim 8, wherein stacking the second forward OLED structure on the first reverse OLED structure specifically comprises:

removing the protective layer covering the pixel definition layer and the conductive layer prepared on the substrate by a stripping technology;

preparing an inverted trapezoidal pixel definition layer by the photolithography technique of coating, exposing and the development processes;

preparing a third transparent anode on the inverted trapezoidal pixel definition layer by the thermal evaporation;

removing the inverted trapezoidal pixel definition layer by the stripping technology;

disposing a third hole injection layer, a third hole transport layer, a third light-emitting layer, a third electron transport layer, a third electron injection layer and a transparent cathode of the second forward OLED structure sequentially on the third transparent anode by the thermal evaporation.

10. The method of making a stacked OLED device according to claim 9, wherein a type of the mask used for the vapor deposition of the third transparent anode is first open mask, and another type of the mask used for the vapor deposition of the transparent anode is a third open mask, and other type of the mask used for the other layers is the first open mask.

* * * * *